United States Patent
Hanaoka et al.

(10) Patent No.: US 6,852,621 B2
(45) Date of Patent: Feb. 8, 2005

(54) SEMICONDUCTOR DEVICE AND MANUFACTURING METHOD THEREFOR, CIRCUIT BOARD, AND ELECTRONIC EQUIPMENT

(75) Inventors: Terunao Hanaoka, Suwa (JP); Kenji Wada, Suwa-gun (JP); Nobuaki Hashimoto, Suwa (JP); Haruki Ito, Chino (JP); Kazushige Umetsu, Chino (JP); Fumiaki Matsushima, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/698,432

(22) Filed: Nov. 3, 2003

(65) Prior Publication Data

US 2004/0092099 A1 May 13, 2004

Related U.S. Application Data

(63) Continuation of application No. 09/765,433, filed on Jan. 22, 2001, now Pat. No. 6,667,551.

(30) Foreign Application Priority Data

Jan. 21, 2000 (JP) ........................................ 2000-012670

(51) Int. Cl.$^7$ .......................................... H01L 21/4763
(52) U.S. Cl. ...................... 438/638; 438/639; 438/640; 438/667
(58) Field of Search ................................ 438/638, 639, 438/640, 667

(56) References Cited

U.S. PATENT DOCUMENTS

| 4,622,097 | A | | 11/1986 | Tsukagoshi et al. | |
|---|---|---|---|---|---|
| 4,806,111 | A | * | 2/1989 | Nishi et al. | 439/109 |
| 4,808,273 | A | | 2/1989 | Hua et al. | |
| 5,229,647 | A | | 7/1993 | Gnadinger | |
| 5,438,212 | A | | 8/1995 | Okaniwa | |
| 5,707,893 | A | * | 1/1998 | Bhatt et al. | 216/18 |
| 5,817,405 | A | * | 10/1998 | Bhatt et al. | 428/209 |
| 6,013,948 | A | | 1/2000 | Akram et al. | |
| 6,365,513 | B1 | * | 4/2002 | Furukawa et al. | 438/667 |
| 6,521,530 | B2 | * | 2/2003 | Peters et al. | 438/667 |
| 6,667,551 | B2 | * | 12/2003 | Hanaoka et al. | 257/750 |
| 2001/0015652 | A1 | * | 8/2001 | Eldridge et al. | 324/761 |
| 2003/0162326 | A1 | * | 8/2003 | Tsubosaki et al. | 438/109 |
| 2004/0134682 | A1 | * | 7/2004 | En et al. | 174/258 |

FOREIGN PATENT DOCUMENTS

| JP | 58-037944 | 3/1983 |
|---|---|---|
| JP | A 59-222954 | 12/1984 |
| JP | B2 2988045 | 10/1999 |

OTHER PUBLICATIONS

IBM Technical Bulletin, vol. 34, Issue No. 34, pp. 416–418, Dec. 1, 1991.

* cited by examiner

*Primary Examiner*—W. David Coleman
*Assistant Examiner*—Khiem Nguyen
(74) *Attorney, Agent, or Firm*—Oliff & Berridge, PLC

(57) ABSTRACT

A method of manufacturing a semiconductor device comprises a step of forming a through-hole in a semiconductor chip having an electrode and forming a conductive layer on a region comprising an inner side of the through-hole. An intermediate portion of the through-hole is formed to be larger than an edge portion thereof, and the conductive layer is formed by electroless plating.

19 Claims, 11 Drawing Sheets

SEMICONDUCTOR DEVICE AND MANUFACTURING METHOD THEREFOR, CIRCUIT BOARD, AND ELECTRONIC EQUIPMENT

INCORPORATION BY REFERENCE

This is a Continuation of application Ser. No. 09/765,433 filed Jan. 22, 2001 now U.S. Pat. No. 6,667,551. The entire disclosure of the prior application is hereby incorporated by reference herein in its entirety.

BACKGROUND OF THE INVENTION

1. Field of the Invention

The present invention relates to a semiconductor device and manufacturing method therefor, a circuit board, and electronic equipment.

2. Description of the Related Art

Semiconductor devices have recently been developed in which a plurality of semiconductor chips are formed into a stack. In many cases, electrical connections are intended to be done by bonding wires or leads to electrodes of the semiconductor chips, but the limit of miniaturization has been reached for the provision of wires and similar components. Electrical connections have also been developed such that a through-hole is formed in a semiconductor chip, then solder is poured into the through-hole. However, voids occur when solder is poured into tiny through-holes, making it difficult to guarantee reliable electrical connections

SUMMARY OF THE INVENTION

The present invention was devised to solve the above problem and has as an objective thereof the provision of a semiconductor device and manufacturing method therefor, a circuit board, and electronic equipment that enable simplification by highly reliable electrical connections.

(1) A method of manufacturing a semiconductor device in accordance with one aspect of the present invention comprises:

a first step of forming a through-hole in a semiconductor element having an electrode; and a second step of forming a conductive layer in a region including an inner side of the through-hole.

This aspect of the present invention enables an electrical connection between one surface of the semiconductor element and the other surface thereof, by the formation of the conductive layer in the through-hole. By simply forming this conductive layer without having to fill the through-hole with a molten material, therefore, it becomes possible to ensure highly reliable electrical connections with no problems concerning the formation of voids.

(2) With this method of manufacturing a semiconductor device, a hole may be formed in the electrode to overlap with the through-hole, the conductive layer may be formed on at least part of the electrode.

This makes it possible to form the conductive layer having an electrical connection with the electrode.

(3) With this method of manufacturing a semiconductor device, the through-hole may be formed to a shape having an aperture edge portion and an intermediate portion of which width is larger than a width of the aperture edge portion.

This makes it easy to form the conductive layer, because the intermediate portion of the through-hole is of a larger width. It should be noted that "width" means a diameter if the through-hole is a round hole or a length of one side if the through-hole is a rectangular hole.

(4) With this method of manufacturing a semiconductor device, all portions of the intermediate portion may be formed at substantially the same width, and the through-hole may be further formed to a shape having a tapered portion connecting the aperture edge portion with the intermediate portion.

Since this ensures that the width of the intermediate portion is substantially uniform over all portions thereof, stresses are made uniform and it is possible to suppress any drop in the strength of the semiconductor element due to the formation of the through-hole (5) With this method of manufacturing a semiconductor device, the through-hole may be formed in the first step by first forming a pinhole of a width smaller than a width of the through-hole, then expanding the pinhole.

This makes it possible to form the pinhole with less energy than that required for forming the through-hole, so that less energy is used for forming the through-hole by forming the pinhole.

(6) With this method of manufacturing a semiconductor device, a cavity may be formed in the first step at a position at which the through-hole is to be formed, then the pinhole may be formed by positioning at the cavity.

Since the position at which the through-hole is formed can be confirmed by the cavity, it is possible to form the through-hole at an accurate position.

(7) With this method of manufacturing a semiconductor device, the pinhole may be formed by a laser beam, then the pinhole may be enlarged by wet etching.

This makes it easy to form the through-hole. In addition, since the pinhole is enlarged by wet-etching, it is possible to form the through-hole with smooth inner surfaces, even if the inner surfaces of the pinhole formed by the laser beam is rough.

(8) With this method of manufacturing a semiconductor device, the method may further comprise a step of forming an electrical connection portion.

(9) With this method of manufacturing a semiconductor device, the electrical connection portion may be formed as part of the conductive layer in the second step.

(10) With this method of manufacturing a semiconductor device, the method may further comprise a step of forming an insulation film on an inner surface of the through-hole, after the first step and before the second step, and the conductive layer may be formed on the insulation film in the second step.

(11) With this method of manufacturing a semiconductor device, the insulation film may be formed by chemical vapor deposition.

(12) With this method of manufacturing a semiconductor device, the conductive layer may be formed by electroless plating.

It is particularly preferable that easy stirring of the plating liquid is enabled by making the shape of the intermediate portion of the through-hole expand to be larger.

(13) With this method of manufacturing a semiconductor device, a catalyst may be exposed in at least a region in which the conductive layer is formed, electroless plating may be performed to extract a conductive material in the exposed region of the catalyst, and the conductive layer may be formed from the conductive material.

(14) With this method of manufacturing a semiconductor device, the semiconductor element may be a semiconductor chip.

(15) With this method of manufacturing a semiconductor device, the semiconductor element may be part of a semiconductor wafer.

(16) A method of manufacturing a semiconductor device in accordance with another aspect of the present invention further comprise a step of stacking semiconductor devices that were formed by the above described method, and electrically connecting together the conductive layer of each of upper and lower semiconductor devices.

A three-dimensional structure can be applied to this method of manufacturing a semiconductor device.

(17) The method of manufacturing a semiconductor device in this aspect may further comprise a step of cutting the semiconductor wafer into pieces.

(18) A semiconductor device in accordance with further aspect of the present invention is manufactured by the above-described method.

(19) A semiconductor device in accordance with still further aspect of the present invention comprises:

a semiconductor element having an electrode and in which a through-hole is formed; and a conductive layer formed in a region including an inner side of the through-hole.

This aspect of the present invention enables an electrical connection between one surface of the semiconductor element and the other surface thereof, by the formation of the conductive layer in the through-hole. By simply forming this conductive layer without having to fill the through-hole with a molten material, therefore, it becomes possible to ensure highly reliable electrical connections with no problems concerning the formation of voids.

(20) With this semiconductor device, a hole may be formed in the electrode to overlap with the through-hole, the conductive layer may be formed on at least part of the electrode.

This forms the conductive layer in electrical contact with the electrode.

(21) With this semiconductor device, the through-hole may be formed to a shape having an aperture edge portion and an intermediate portion of which width may be larger than a width of the aperture edge portion.

This makes it easy to form the conductive layer, because the intermediate portion of the through-hole is of a larger width. It should be noted that "width" means a diameter if the through-hole is a round hole or a length of one side if the through-hole is a rectangular hole.

(22) With this semiconductor device, all portions of the intermediate portion may be formed at substantially the same width, and the through-hole may be further formed to a shape having a tapered portion connecting the aperture edge portion with the intermediate portion.

Since this ensures that the width of the intermediate portion is substantially uniform over all portions thereof, stresses are made uniform and it is possible to suppress any drop in the strength of the semiconductor element due to the formation of the through-hole.

(23) With this semiconductor device, a connection portion may be provided by part of the conductive layer.

(24) With this semiconductor device, an insulation film may be further formed on an inner surface of the through-hole and the conductive layer may be formed on the insulation film.

(25) With this semiconductor device, the semiconductor element may be a semiconductor chip.

(26) With this semiconductor device, the semiconductor element may be part of a semiconductor wafer.

(27) In a semiconductor device in accordance with even further aspect of the present invention, the above described semiconductor device are stacked, and the conductive layer of each of upper and lower semiconductor devices are connected together electrically.

A three-dimensional structure can be applied to such a semiconductor device.

(28) A circuit board in accordance with yet further aspect of the present invention has a semiconductor device mounted thereon.

(29) Electronic equipment in accordance with more aspect of the present invention is provided with the above described semiconductor device.

DESCRIPTION OF THE PREFERRED EMBODIMENTS

Figure 1A:
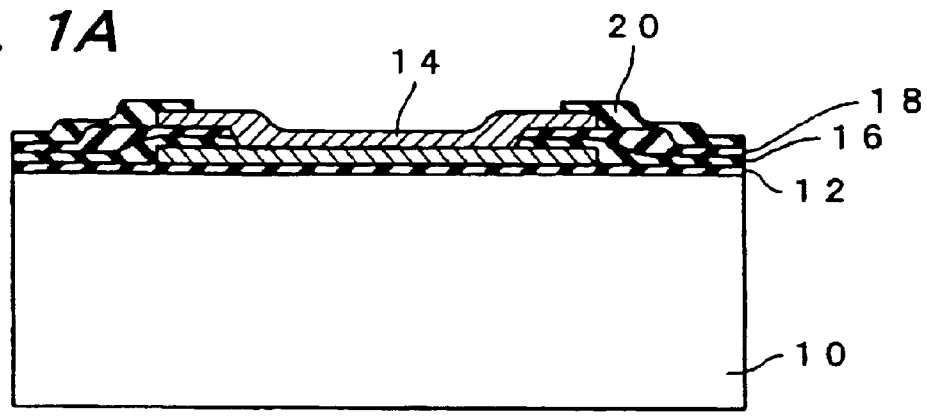
FIGS. 1A to 1C show steps in a method of manufacturing a semiconductor device in accordance with an embodiment to which the present invention is applied.

Preferred embodiments of the present invention are described below with reference to the accompanying figures. FIGS. 1A to 9 show sectional views of a semiconductor chip of which the direction of sight crosses the thickness direction of the semiconductor chip. Part of a semiconductor chip 10 used by this embodiment is shown in FIG. 1A. The semiconductor chip 10 is generally of a rectangular parallelepiped shape (including a cube), but the shape is not limited thereto and it could also be a sphere.

The semiconductor chip 10 has an insulation film (interlayer film) 12 on a surface on which an integrated circuit formed of transistors and memory elements (not shown in the figure) are formed. This insulation film 12 is often an oxidized film of the silicon that is the basic material of the semiconductor chip 10. Electrodes (pads) 14 are formed on the insulation film 12 and these electrodes 14 are connected electrically to an integrated circuit by portions that are not shown in the figures. The electrodes 14 are often formed of aluminum. The electrodes 14 run along at least one edge of the surface of the semiconductor chip 10 (often two or four edges). The electrodes 14 are formed along edge portions of the surface of the semiconductor chip 10, and they are also formed along a central portion thereof.

The electrodes 14 are formed in accordance with the process of manufacturing the integrated circuit. In the example shown in FIG. 1A, a lower-layer portion of each electrode 14 is formed on the insulation film 12, insulation films 16 and 18 are formed over edge portions of this lower-layer portion, and an upper-layer portion of the electrode 14 is formed to extend over the insulation film 18. A passivation film 20 is formed to cover edge potions of the electrodes 14, avoiding central portions thereof. The passivation film 20 could be made of a material such as $SiO_2$, SiN, or a polyimide resin.

In this embodiment of the present invention, the above described semiconductor chip 10 is used in the manufacture of a semiconductor device in accordance with the method described below.

Figure 1B:
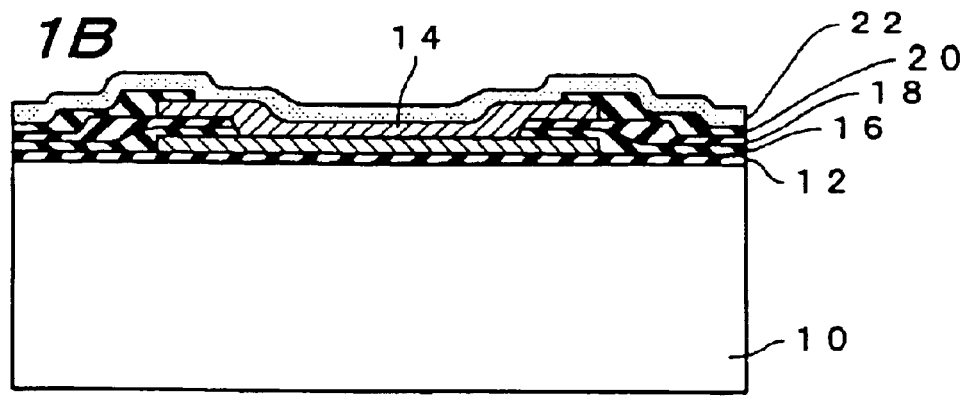

A resist layer 22 is formed on the surface of the semiconductor chip 10 on which the electrodes 14 are formed, as shown in FIG. 1B. The method of forming the resist layer 22 could be spin-coating, dipping, or spray-coating, by way of example. The resist layer 22 is formed to cover the electrodes 14 as well. This resist layer 22 is designed to cover portions that are not to be etched by an etching step that will be described later. The resist layer 22 could be any of a photoresist, electron-beam resist, or X-ray resist, and of either a positive or negative form. The resist layer 22 used in this embodiment of the present invention is a photoresist of a positive form. After the resist layer 22 has been coated, it is pre-baked to drive off its solvent, to avoid it attaching to other components.

Figure 1C:
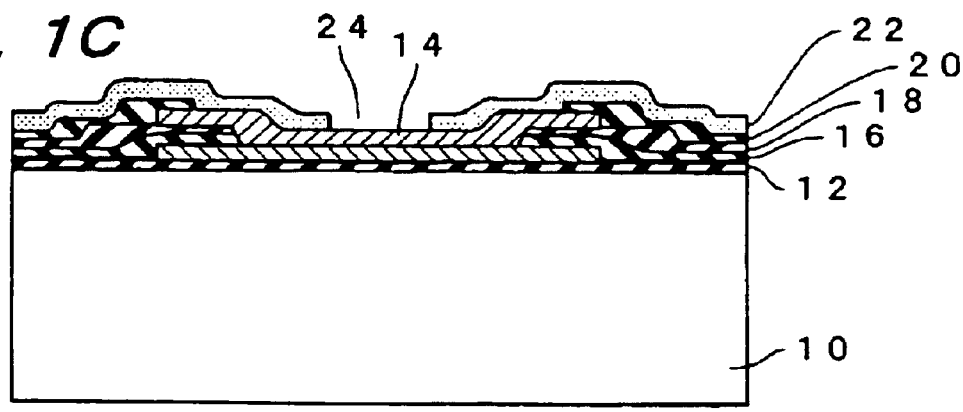

The resist layer 22 is patterned as shown in FIG. 1C. More specifically, a mask is placed on the resist layer 22 and energy is made incident thereon. This energy will depend on the material of the resist layer 22, but could be any of light, electrons, or X-rays. In this embodiment of the invention, the resist layer 22 is exposed by light. The shape of the mask is determined by the form of the patterning, and could be an inverted shape, depending on whether the resist layer 22 is of a positive or a negative form.

After the exposure, the resist layer 22 is developed and post-baked. An aperture portion 24 that exposes a central portion of each of the electrodes 14 is formed in the patterned resist layer 22.

Figure 2A:
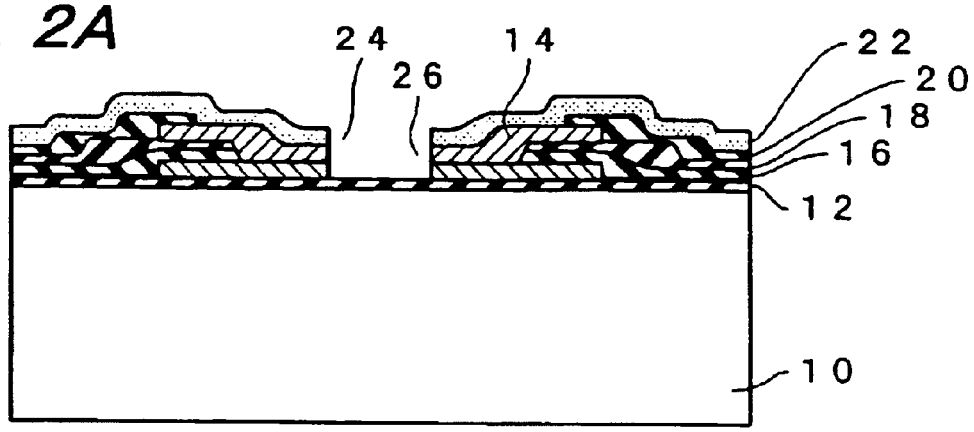
FIGS. 2A to 2C show further steps in the method of manufacturing a semiconductor device in accordance with this embodiment to which the present invention is applied.

The central portion of the electrode 14 that is exposed by the aperture portion 24 of the resist layer 22 is etched, as shown in FIG. 2A. It is preferable to use dry etching therefor. This dry etching could be reactive ion etching (RIE). Alternatively, the etching could be wet etching. A hole 26 is formed in a central portion (the portion except for the edge portions) of each electrode 14. The hole 26 is formed in a position of a through-hole 50, which will be described later. More specifically, the hole 26 is formed to a size that is substantially the same as an aperture edge portion of the through-hole 50 or is greater thereof, for the passage of the through-hole 50.

Figure 2B:
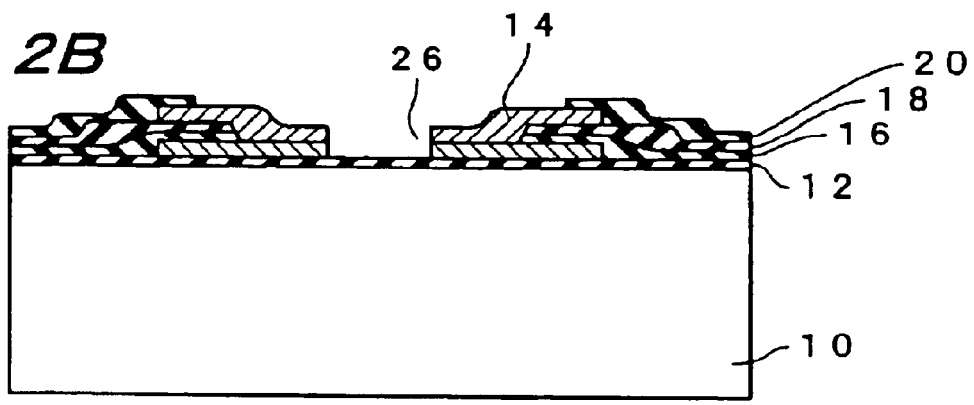
Figure 2C:
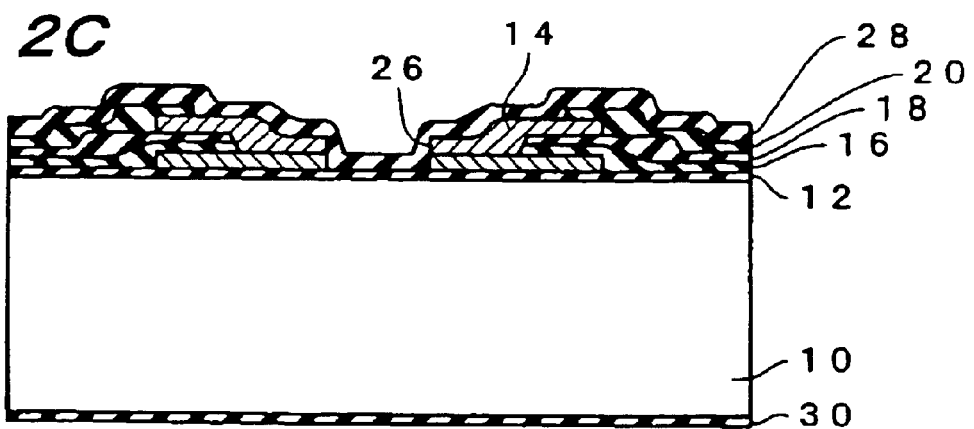

The resist layer 22 is removed as shown in FIG. 2B. Insulation films 28 and 30 are formed on the side of the semiconductor chip 10 on which the electrodes 14 are formed and on the opposite side thereof, as shown in FIG. 2C. The insulation film 28 could be a silicon oxide film or nitride film, and it could be formed by chemical vapor deposition (CVD). The insulation film 28 covers the electrodes 14 and the passivation film 20. Since the hole 26 has been formed in each electrode 14, the insulation film 28 also covers the inside (the inner surface and the exposed insulation film 12) of the hole 26.

Figure 3A:
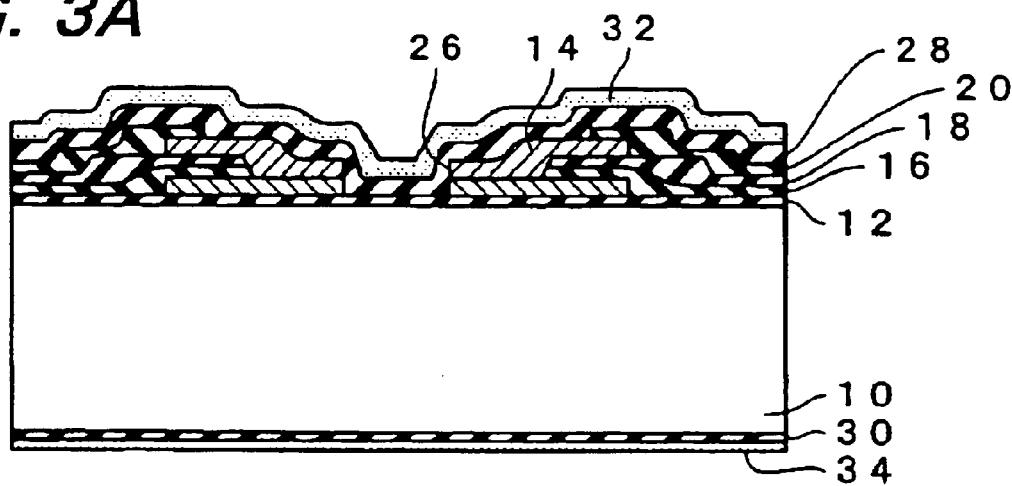
FIGS. 3A to 3C show even further steps in the method of manufacturing a semiconductor device in accordance with this embodiment to which the present invention is applied.

Resist layers 32 and 34 are formed on the side of the semiconductor chip 10 on which the electrodes 14 are formed and on the opposite side thereof, as shown in FIG. 3A. The resist layers 32 and 34 correspond to the details given previously for the resist layer 22. The sequence could be such that one of the resist layers 32 and 34 (such as the resist layer 32) is formed on the side of the semiconductor chip 10 on which the electrodes 14 are formed, by way of example, the assembly is pre-baked, the other resist layer (such as the resist layer 34) is formed, and then the assembly is pre-baked again.

Figure 3B:
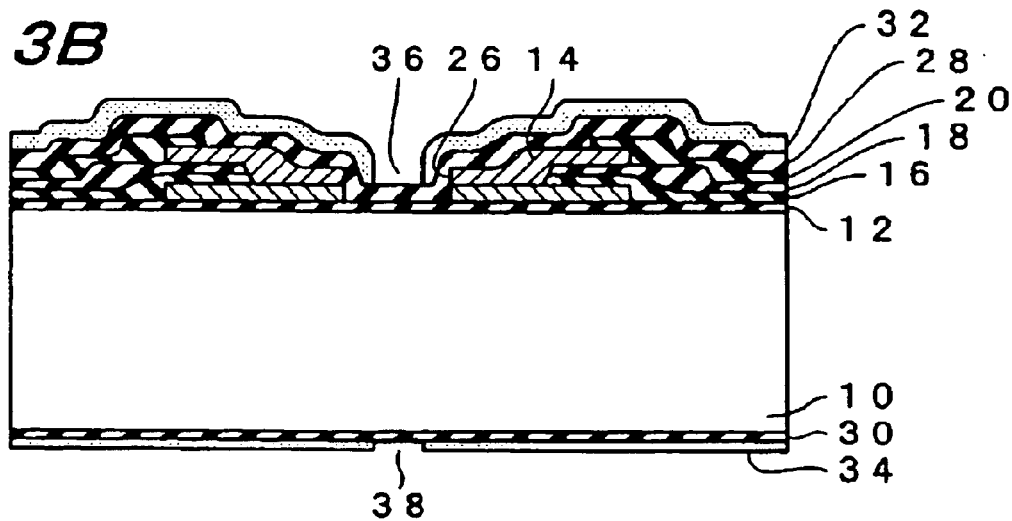

The resist layers 32 and 34 are patterned as shown in FIG. 3B to form aperture portions 36 and 38 at the position of the through-hole 50, which will be described later. The aperture portion 36 is formed on the inner side of the hole 26 of the electrode 14. The insulation film 28 is interposed between the hole 26 and the aperture portion 36. The aperture portions 36 and 38 cause parts of the insulation films 28 and 30 to be exposed. Any of the methods described above with reference to the resist layer 22 could be applied for patterning the resist layers 32 and 34.

Figure 3C:
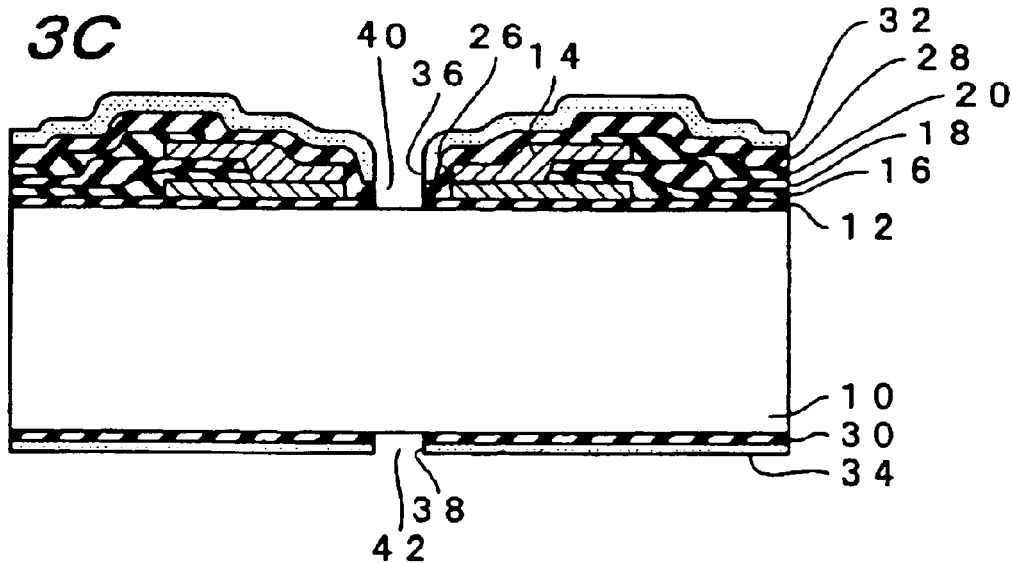

A hole 40 is formed on the inner side of the hole 26 of the electrode 14, in the insulation films 12 and 16, and a hole 42 is formed in the insulation film 30, as shown in FIG. 3C.

Figure 4A:
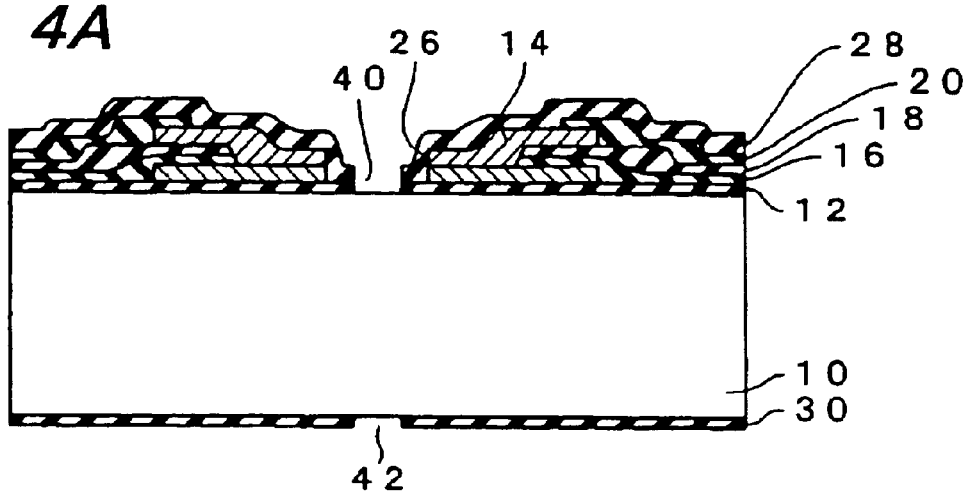
FIGS. 4A to 4C show yet further steps in the method of manufacturing a semiconductor device in accordance with this embodiment to which the present invention is applied.
Figure 4B:
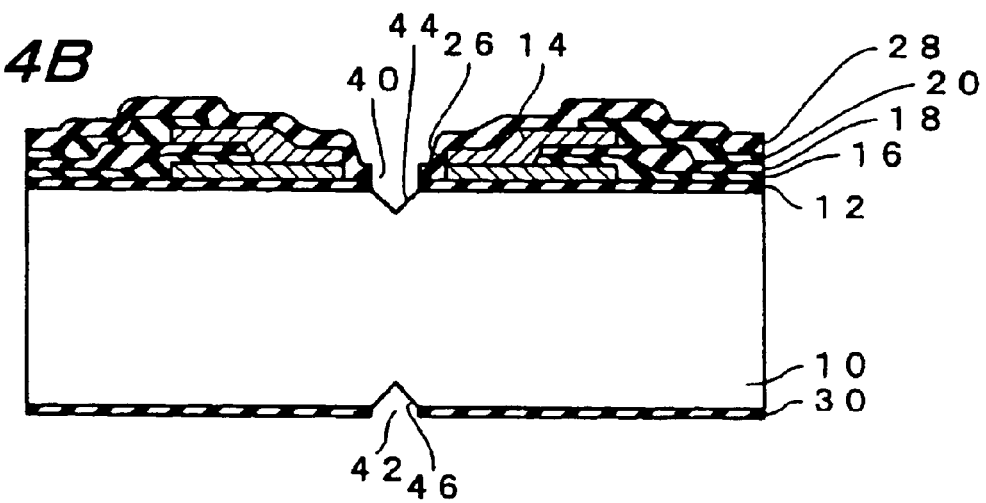

The resist layers 32 and 34 are removed as shown in FIG. 4A. The portions of the semiconductor chip 10 exposed within the holes 40 and 42 are etched, as shown in FIG. 4B. The thus-etched portions are portions that will not form the integrated circuit and are formed of silicon. This etching forms cavities 44 and 46 that are visible to the naked eye. The shapes of the cavities 44 and 46 are not particularly limited, so they could be tapered or have wall surfaces that are perpendicular to the surface. It would be simple to apply wet etching for this etching, but dry etching could also be applied therefor. The type of etching will determine the shape of the cavities 44 and 46.

Figure 4C:
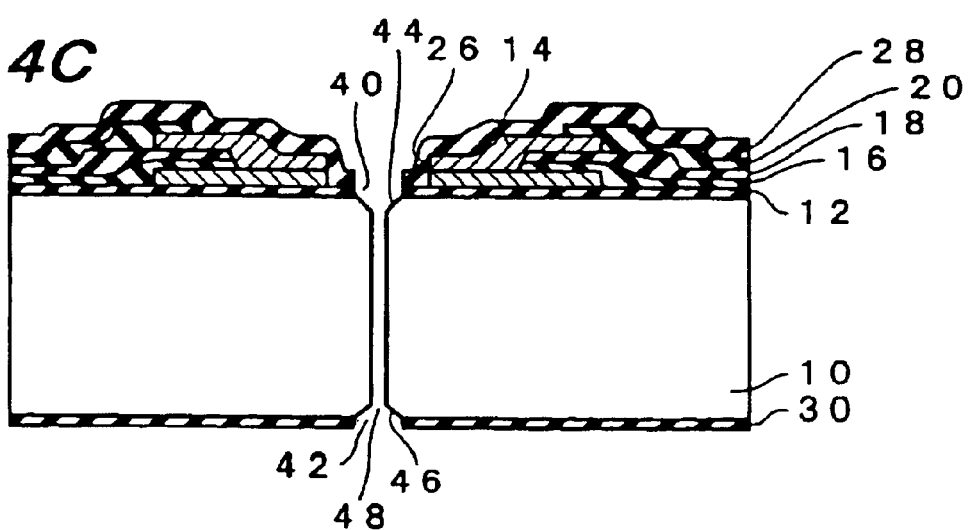

A pinhole 48 (of a diameter of approximately 20 $\mu$m, by way of example) is formed in the semiconductor chip 10 as shown in FIG. 4C. The pinhole 48 is of a diameter less than that of the through-hole 50, which will be described later, and is formed at the center of the through-hole 50. The formation of the pinhole 48 could be done by using a laser (such as a YAG laser or $CO_2$ laser). The laser beam can be shone thereon after its position is verified by the cavities 44 and 46. The laser beam could either be shone from one surface of the semiconductor chip 10 to form the pinhole 48, or it could be shone from both surfaces of the semiconductor chip 10 (sequentially or simultaneously). If the laser beam is shone from both surfaces, the effects on the semiconductor chip 10 are less.

Figure 5A:
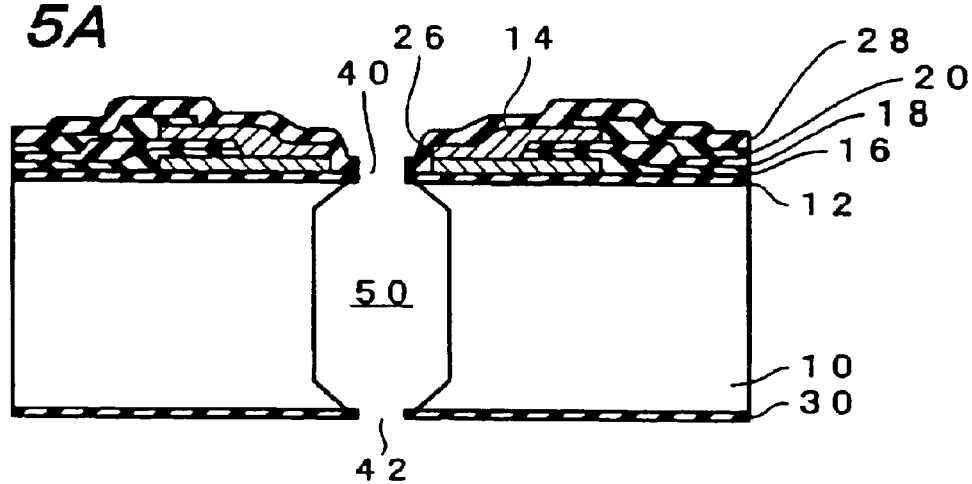
FIGS. 5A to 5C show still further steps in the method of manufacturing a semiconductor device in accordance with this embodiment to which the present invention is applied.

The through-hole 50 is then formed in the semiconductor chip 10, as shown in FIG. 5A. This through-hole 50 is formed by expanding the pinhole 48. If wet etching is employed, for example, the inner surfaces of the pinhole 48 could also be etched. An aqueous solution (buffered hydrofluoric acid) in which hydrofluoric acid and ammonium fluoride are mixed could be used as the etching liquid.

The through-hole 50 could have a shape such that it has aperture edge portions having a width A and an intermediate portion having a width B (such as approximately 40 $\mu$m to 50 $\mu$m) that is larger than the width A. It should be noted that "width" means a diameter if the through-hole 50 is a round hole or a length of one side if the through-hole 50 is a rectangular hole. Subsequent CVD or electroless plating is facilitated by making the diameter of the intermediate portion of the through-hole 50 as large as possible. The intermediate portion could also have substantially the same diameter in all portions thereof. In other words, the inner surfaces of the intermediate portion of the through-hole 50 could subtend straight lines through a section that passes through the central axis of the through-hole 50. This shape is obtained by expanding the pinhole 48 by wet etching. This shape makes it possible to suppress any drop in the strength of the semiconductor chip 10 caused by the formation of the through-hole 50. The through-hole 50 could equally well have a tapered portion that connects each aperture edge portion to the intermediate portion thereof. This tapered portion is also formed by expanding the pinhole 48 by wet etching.

Figure 5B:
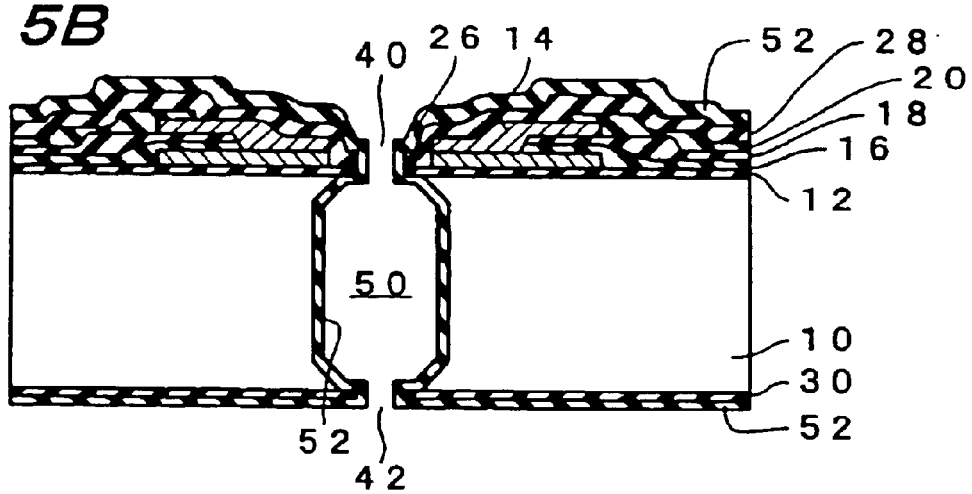

An insulation film 52 is formed over at least the inner surfaces of the through-hole 50, as shown in FIG. 5B. The formation of the insulation film 52 could be done by applying CVD. If the diameter of the intermediate portion of the through-hole 50 is greater than that of the aperture edge portions, CVD is facilitated. The insulation film 52 could be formed over regions other than the inner surfaces of the through-hole 50. The insulation film 52 could also be formed over the insulation films 28 and 30, by way of example. It should be noted, however, that care should be taken to prevent the insulation film 52 closing the apertures of the through-hole 50.

The insulation film 52 could be formed of an organic material such as a polyimide resin, epoxy resin, or silicone modified resin. Examples of the method used for covering with the organic insulation film include a spray-coating, a method of immersing the semiconductor chip 10 in the organic material in liquid form and applying ultrasonic vibration, a method of sucking the organic material in liquid form into the through-hole 50, resin printing in the atmosphere or a vacuum, or an ink-jet method using the organic material in liquid form or a ceramic (such as $SiO_2$) in liquid form.

Figure 5C:
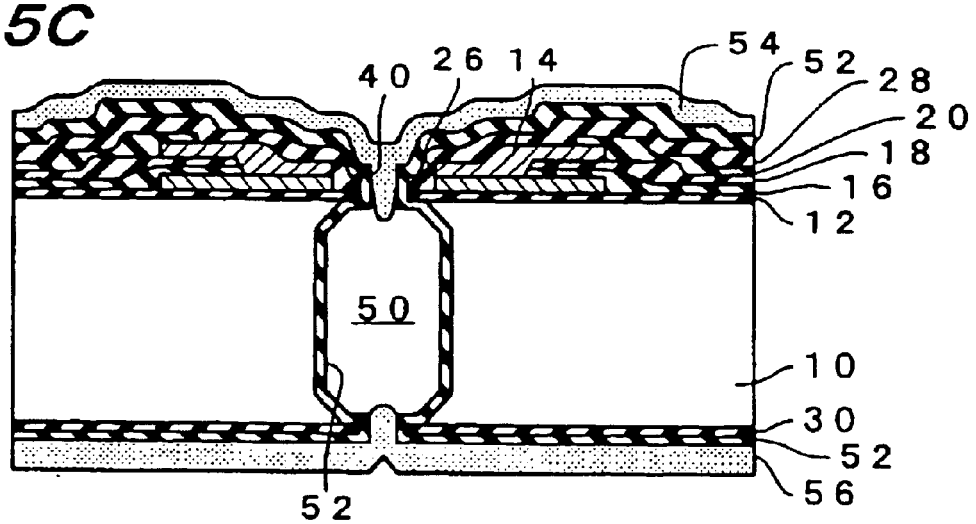

A resist layer 54 is formed on the side of the semiconductor chip 10 on which the electrodes 14 are formed, as shown in FIG. 5C. The resist layer 54 is formed to close off one aperture of the through-hole 50 in the semiconductor chip 10. The details given previously with reference to the resist layer 22 can also be applied for the structure and method of formation of the resist layer 54. Note that another resist layer 56 could also be formed on the opposite side, at the same time as the formation of the resist layer 54. The resist layers 54 and 56 are then pre-baked.

Figure 6A:
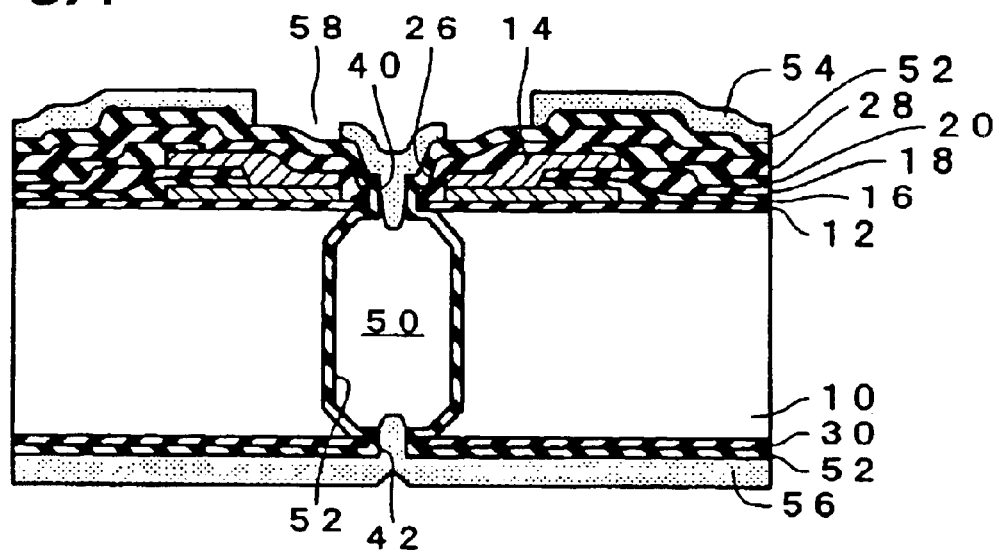
FIGS. 6A to 6B show more steps in the method of manufacturing a semiconductor device in accordance with this embodiment to which the present invention is applied.

The resist layer 54 that is formed on the electrodes 14 side is patterned to form an aperture portion 58, as shown in FIG. 6A. The aperture portion 58 is formed over at least part of each electrode 14, but is designed to leave part of the resist layer 54 remaining above the through-hole 50. The shape of the aperture portion 58 could be such that a ring is formed between the outer periphery of part thereof that includes the region of each electrode 14 and the inner periphery of a part thereof that covers at least the aperture edge portion of the through-hole 50. Note that this ring shape could be a square ring shape or a circular ring shape. The aperture portion 58 causes part of the insulation film 52 to be exposed. The details given previously with reference to the resist layer 22 can also be applied to this patterning method. After the patterning is finished, the resist layer 54 is developed and post-baked.

Figure 6B:
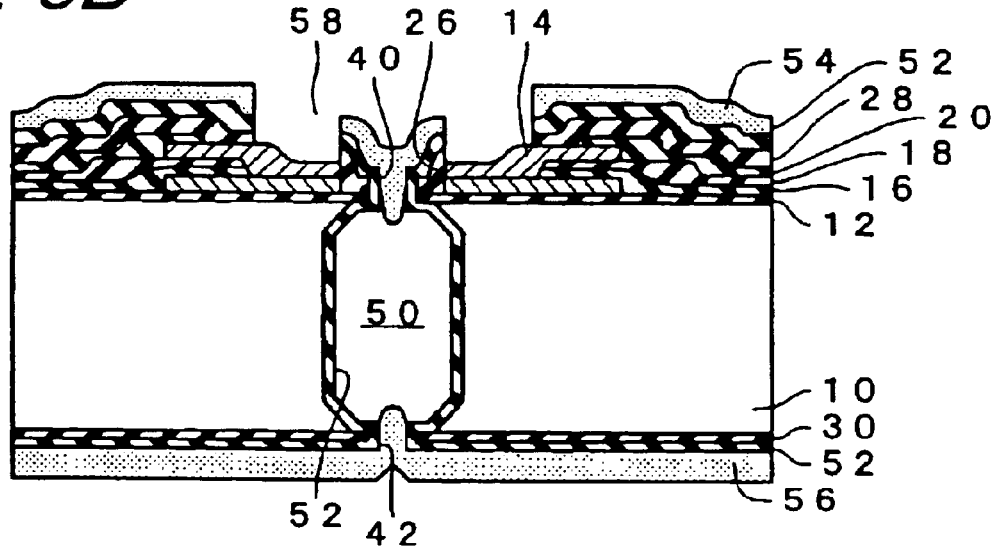

The patterned resist layer 54 is used as a mask to etch the insulation films 52 and 27 and thus expose part of the electrode 14, as shown in FIG. 6B. Since the part of the electrode 14 that is exposed in this case is a portion designed for electrical connection, it is preferably large. The resist layers 54 and 56 are then removed.

Figure 7A:
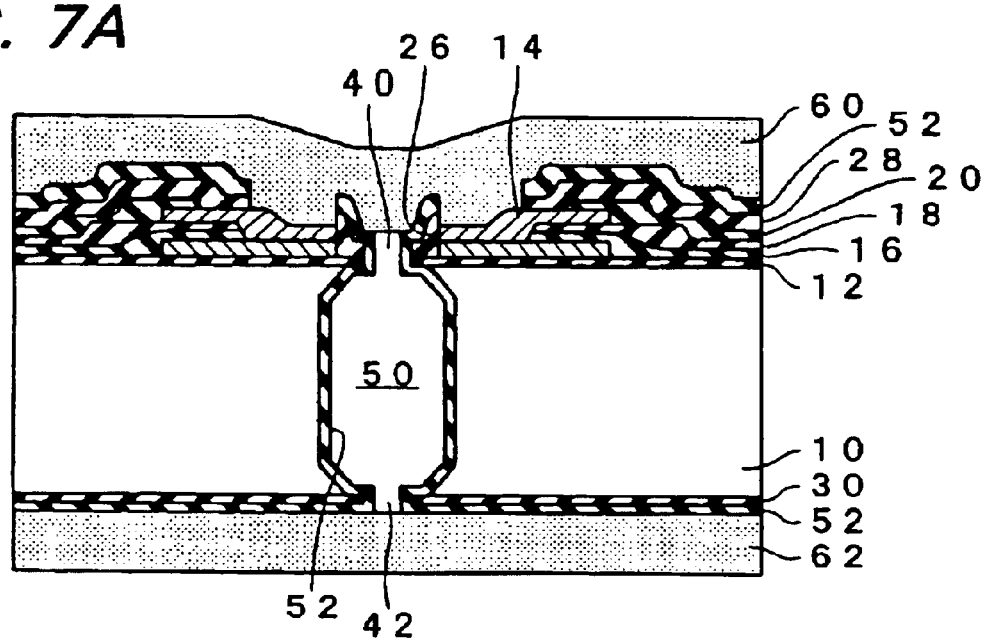
FIGS. 7A to 7B show even more steps in the method of manufacturing a semiconductor device in accordance with this embodiment to which the present invention is applied.

Resist layers 60 and 62 are formed on both sides of the semiconductor chip 10, as shown in FIG. 7A. Since the resist layer 60 formed on the side on which the electrodes 14 are formed is formed to have a region with a large step, it is preferable to use a previously formed dry film therefor.

Figure 7B:
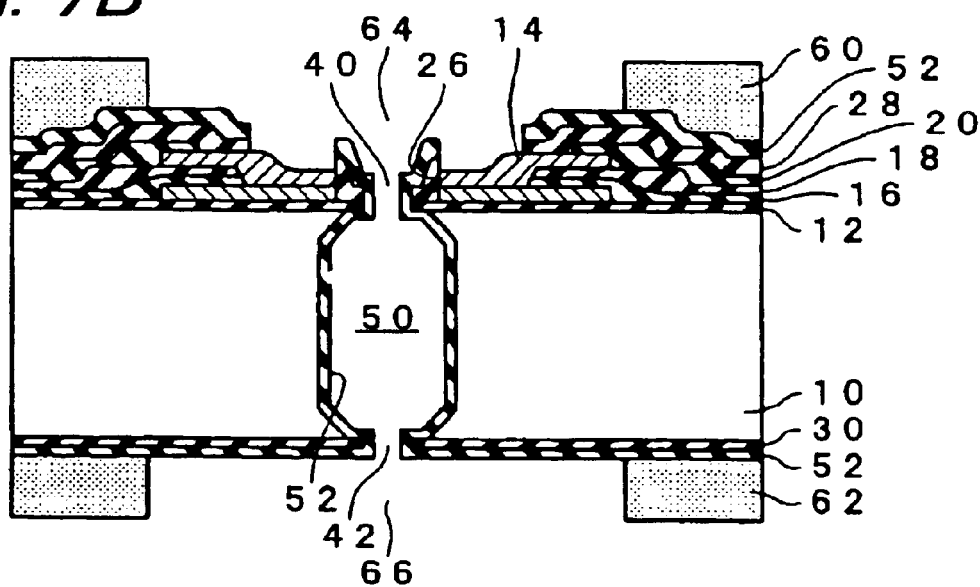

The resist layers 60 and 62 are patterned to form aperture portions 64 and 66 through which the through-hole 50 passes, as shown in FIG. 7B. These aperture portions 64 and 66 form a region for the formation of an electrical connection portion 72 and the aperture portion 64 exposes part of the electrode 14.

Figure 8A:
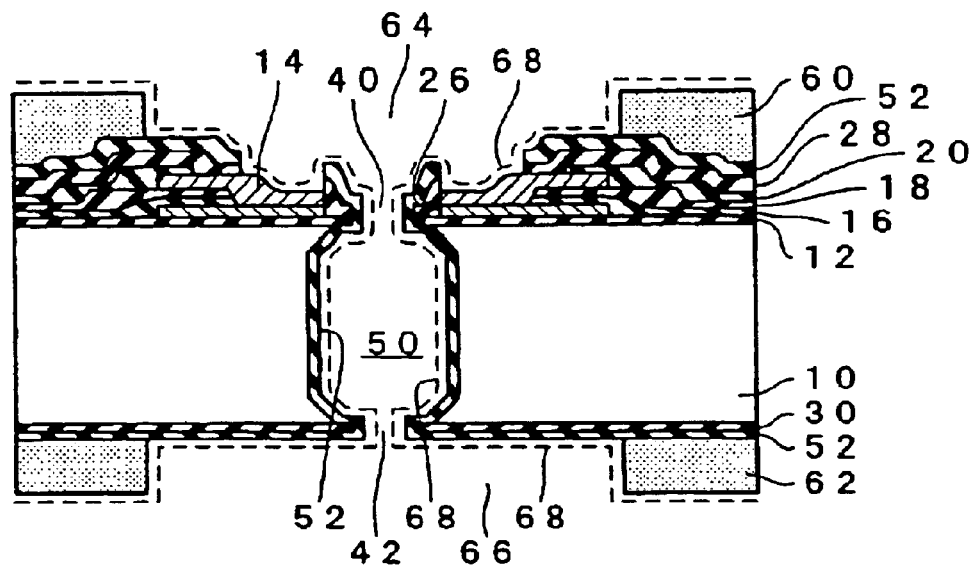
FIGS. 8A to 8B show still more steps in the method of manufacturing a semiconductor device in accordance with this embodiment to which the present invention is applied.

A catalyst 68 for electroless plating is poured from the through-hole 50 as far as the exposed portion of the electrode 14, as shown in FIG. 8A. In this embodiment of the invention, the catalyst 68 is palladium. The method of forming the catalyst 68 could be one in which the semiconductor chip 10 is immersed in a bath of molten palladium and tin, then processed with an acid such as hydrochloric acid to leave the palladium alone. Alternatively, tin ions (reducing agent) could be adsorbed into the semiconductor chip 10 by immersing it in a bath of molten tin chloride, then the semiconductor chip 10 is immersed in molten palladium chloride and the palladium ions are reduced by the tin ions (reducing agent) to extract palladium nuclei (catalyst).

Further alternatively, the catalyst 68 could be provided directly by an ink-jet method. The use of an ink-jet method makes it possible to provide an economic method that is fast and has little waste, by adapting the technology that produced ink-jet printers. Since the ink-jet head has already been developed for applications such as ink-jet printers, it is possible to use a piezo-jet type that uses piezoelectric elements or a bubble-jet type that uses substances that are converted by electrical heat as energy-generating elements, so that the area covered by the jets and the jet pattern can be set as required. This ensures that the electrical connection portions can be formed without any resist patterning step and resist removal step, and without having an etching step if there is a metal layer formed over the entire surface.

Figure 8B:
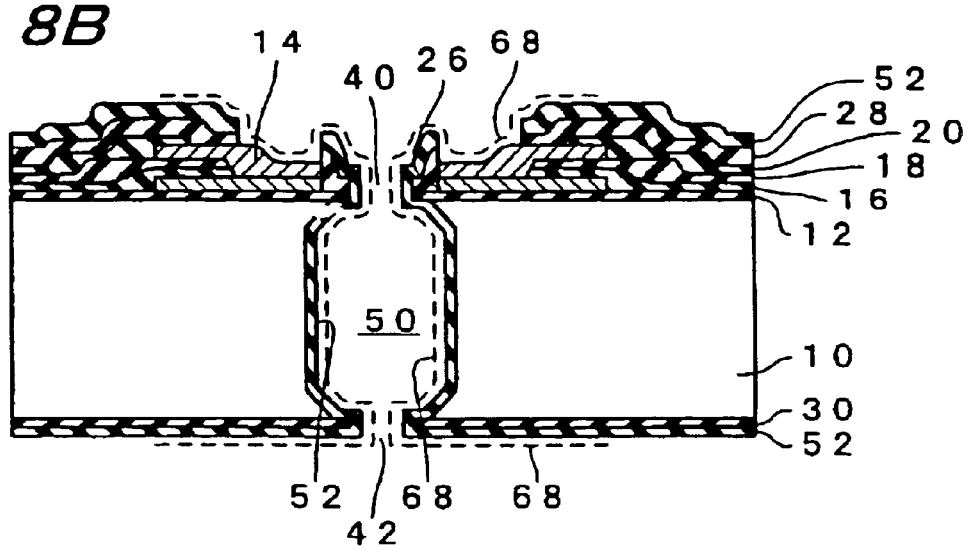

The resist layers 60 and 62 are then removed, as shown in FIG. 8B. The removal of the resist layers 60 and 62 makes it possible to provide the catalyst 68 over only the region in which the electrical connection portion 72 is to be formed. During the removal of the resist layers 60 and 62, the resist layers 60 and 62 could be removed by exposing them to ultraviolet light or by immersing the assembly in a weakly alkaline solution. This enables simple and also reliable removal of the resist layers 60 and 62.

In the above described example, the catalyst 68 is exposed in the region in which the electrical connection portion 72 is to be formed, by providing the catalyst 68 after the resist layers 60 and 62 have been formed, then removing the resist layers 60 and 62. In contrast to this example, the catalyst 68 could equally well be formed over the entire surface, then the catalyst 68 could be made to efficiently expose the region in which the electrical connection portion 72 is to be formed, by providing and patterning the resist layers 60 and 62 that exclude the region in which the electrical connection portion 72 is to be formed. In such a case, the resist layers 60 and 62 are removed after the formation of the electrical connection portion 72 has ended.

Figure 9:
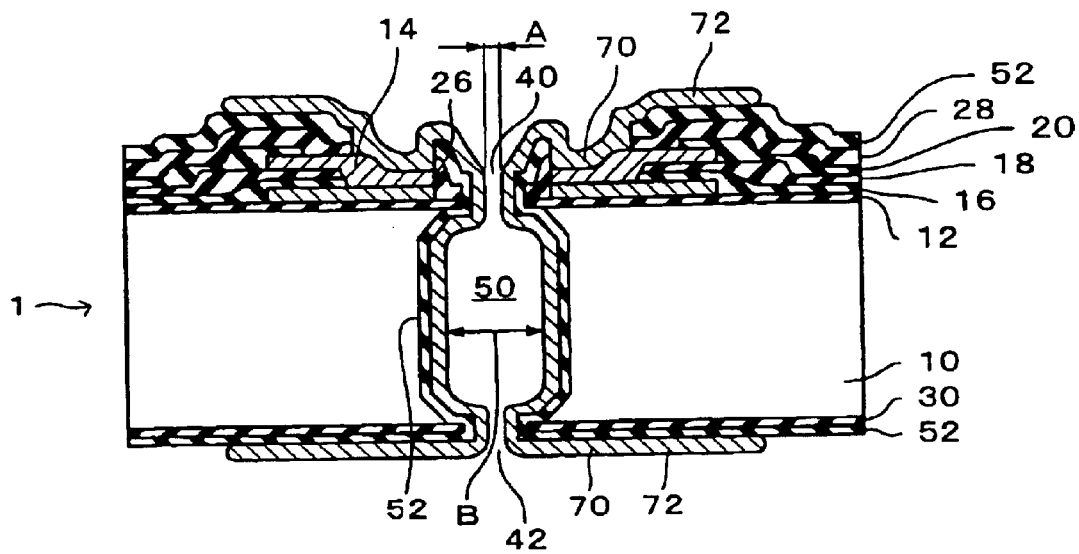
FIG. 9 shows a semiconductor device in accordance with this embodiment of the present invention.

A conductive layer 70 is then formed by electroless plating in the region in which the catalyst 68 is exposed, as shown in FIG. 9. Note that the catalyst 68 is provided over the inner surfaces of the through-hole 50 (the surface of the insulation film 52 in the example shown in FIG. 9), the side on which the electrodes 14 are formed, and the opposite side. The conductive layer 70 is therefore formed continuously from the side on which the electrodes 14 are formed, though the through-hole 50, and onto the opposite side. The conductive layer 70 overlays the electrode 14. In this embodiment of the invention, the diameter of the intermediate portion of the through-hole 50 is greater than that of the aperture edge portion thereof, enabling favorable stirring of the plating liquid.

The material of the conductive layer 70 could be any of Ni, Au, Ni+Au, Cu, Ni+Cu, or Ni+Au+Cu. If copper plating is used, for example, the palladium of the catalyst 68 acts as nuclei to reduce the copper ions in solution, to extract the copper (the conductive layer 70). Note that a plurality of different metals (such as Ni+Cu or Ni+Au+Cu) could be used as the conductive material for the formation of the conductive layer 70, so that the conductive layer 70 is formed as a plurality of layers.

A weakly alkaline copper plating solution could be used for the electroless plating. A solution such as PB-570, which is a mixture of PB-570MU, PB-570A, PB-570B, PB-570C, and PB-570S (produced by Ebara Yuujiiraito Ltd.) could be used as the weakly alkaline (pH in the region of 9) solution for copper plating. Since the copper plating liquid is weakly alkaline, this makes it possible to reduce damage to aluminum of the electrodes 14 that are exposed thereto.

Alternatively, a strongly alkaline solution could be used, provided that a conductive layer (not shown in the figures) is formed on the surface of the electrodes 14 as protection. This conductive layer could be one layer or a plurality of layers. For example, the conductive layer could have a two-layer structure of nickel and gold. In one method of forming a conductive layer of nickel, zincate treatment could be previously performed on the electrodes 14 to substitute zinc for the surface of the aluminum, then the assembly is immersed in a non-electrolytic nickel plating liquid to stack nickel by a substitution reaction between zinc and nickel. Alternatively, aluminum could be immersed in a palladium solution that selectively adsorbs only aluminum, then it is immersed in a non-electrolytic nickel plating liquid to cause the palladium to act as nuclei to form a nickel film. The conductive layer could be formed of nickel alone, but it could then be immersed in a non-electrolytic gold plating liquid to form a film of gold on the nickel surface. The formation of a covering film of gold makes it possible to further ensure electrical connection with the conductive layer 70.

The above examples all related to methods of forming the conductive layer 70 by wet methods (plating), but other known dry methods (such as sputtering) could also be used for this formation method, or a mixture of dry and wet methods could be used therefore.

The electrical connection portion 72 could also be provided. Part of the conductive layer 70 could also be used as the connection portion 72. In such a case, it is preferable to form the conductive layer 70 to be thick (at least approximately 5 $\mu$m, by way of example).

The semiconductor device shown in FIG. 9 is obtained by the above steps. The above-described process makes it possible to ensure electrical connection between both surfaces of the semiconductor chip 10 by the conductive layer 70. A semiconductor device 1 comprises the semiconductor chip 10 having a plurality of electrodes 14 and in which the through-holes 50 are formed, together with the conductive layer 70 that is formed on regions that comprise the inner sides of each of the through-holes 50. The shape of each through-hole 50 is as described previously. The hole 26 for the passage of the through-hole 50 is formed in each electrode 14. The conductive layer 70 is formed to overlap at least part of each electrode 14. Part of the conductive layer 70 also becomes the electrical connection portion 72. The insulation film 52 is formed under the conductive layer 70 on the inner side of each through-hole 50, to shield the integrated circuitry formed within the semiconductor chip 10 from electrical connections.

Figure 10:
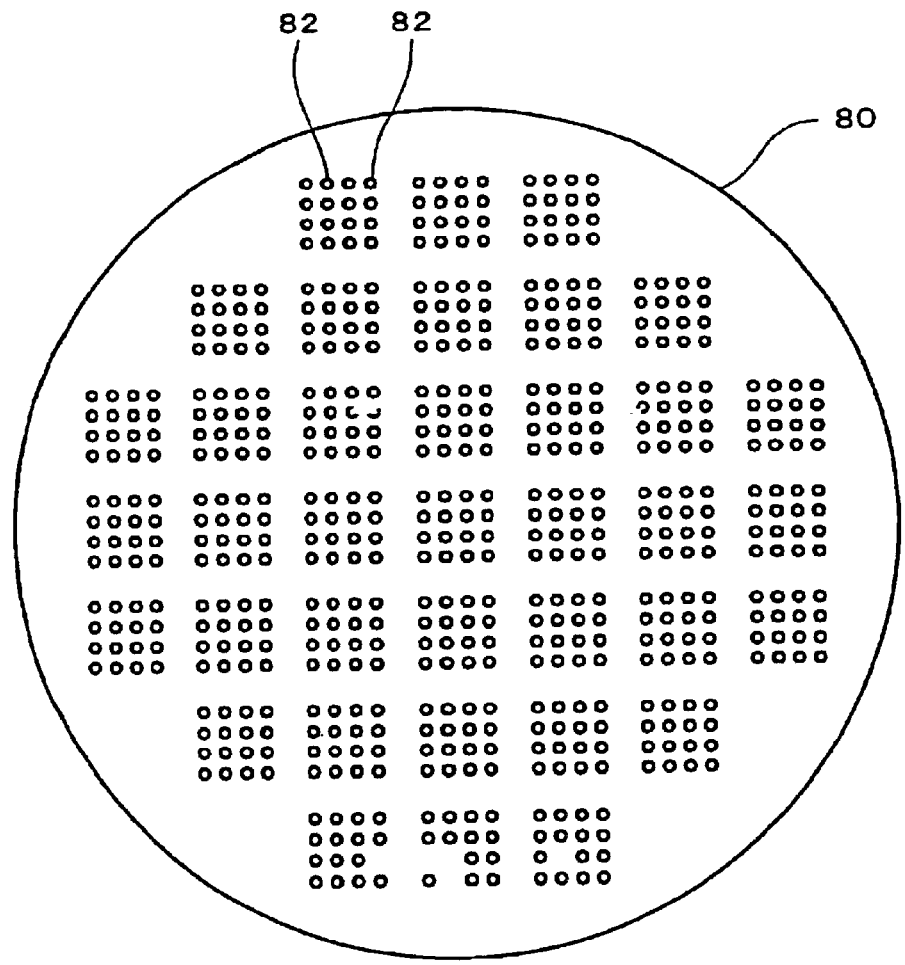
FIG. 10 shows a step in another method of manufacturing a semiconductor device in accordance with an embodiment of the present invention.

The above-described process was applied to the semiconductor chip 10 but it could equally well be applied to a semiconductor wafer. For example, electrical connection portions 82 could be formed by the above-described steps on a semiconductor wafer 80, as shown in FIG. 10. The semiconductor device 1 of FIG. 9 can be obtained by dicing the semiconductor wafer 80.

Figure 11:
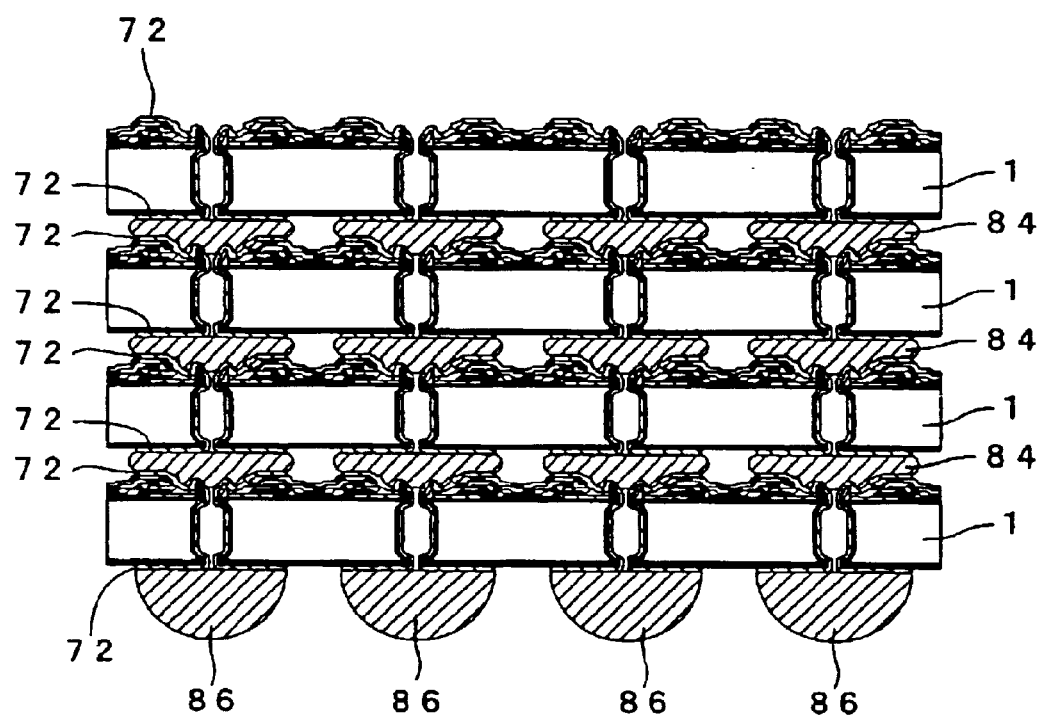
FIG. 11 shows another semiconductor device in accordance with this embodiment of the present invention.

A plurality of semiconductor devices 1 can also be stacked as shown in FIG. 11, to configure a three-dimensional (stacked) semiconductor device. In the example shown in FIG. 11, the electrical connection portions 72 of adjacent semiconductor devices 1 are connected electrically by a solder 84 such as a soft solder.

A liquid or gel-type adhesive could be used as an adhesive thereof, or a contact sheet could be used therefor. The adhesive could have epoxy resin as the main material thereof. The adhesive could be insulating.

A conductive substance could be comprised within the adhesive to improve the electrical conductivity between similar connective bodies. The conductive substance could be formed of particles of solder or soft solder, dispersed in an adhesive material. This configuration makes it possible for those particles to act as solder when similar connective bodies are linked, thus dramatically increasing the connectivity even further.

The adhesive could be an anisotropic conductive adhesive (ACA) in which conductive particles are dispersed, such as an anisotropic conductive film (ACF) or an anisotropic conductive paste (ACP). An anisotropic conductive adhesive has conductive particles (filler) dispersed in a binder, so that a dispersion agent is often added thereto. A thermal hardening adhesive is often used as the binder for an anisotropic conductive adhesive. In such a case, the conductive particles are interposed between the wiring pattern and each electrode, intending to provide electrical connection therebetween.

The power of contraction of an insulating adhesive could be used to bring adjacent electrical connection portions 72 directly together, so that the upper and lower semiconductor devices 1 are bonded together by the adhesive. In such a case, it is preferable to form each electrical connection portion 72 in the shape of a bump.

A metal connection such as that of Au—Au, Au—Sn, or solder could be applied to provide electrical connections between the connection portions 72. The two sides could be bonded by the application of heat alone, ultrasonic vibration alone, or heat and ultrasonic vibration. If connected, the material of the electrical connection portions 72 will be dispersed by the vibration or heat to form metal bonds.

External pins 86 are provided on the electrical connection portions 72 of the semiconductor device 1 that is at the lowermost (or uppermost) position. The external pin 86 could be formed by solder or metal, but they could also be formed of a conductive material. In this embodiment of the invention, the external pins 86 are solder balls.

Solder balls are not always necessary, and a semiconductor device could be mounted on a substrate to form a semiconductor module. In addition, a semiconductor device could be mounted on a motherboard and a solder cream is painted onto the motherboard side, without using solder balls, and the electrical connection portions are formed by the surface tension thereof when molten.

Furthermore, a plurality of the semiconductor wafers 80 of FIG. 10 obtained by the above described process could be stacked, connection portions thereof connected electrically, and the stack is then diced to form the semiconductor device shown in FIG. 11.

Figure 12:
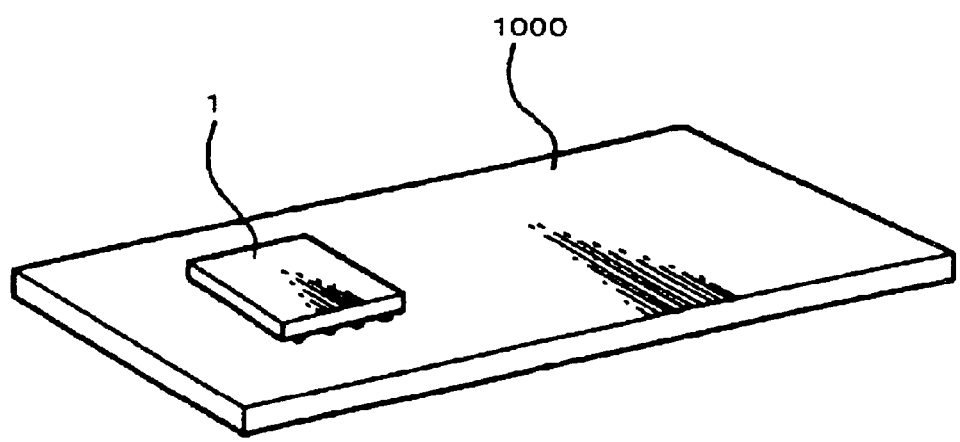
FIG. 12 shows a circuit board on which is mounted the semiconductor device in accordance with this embodiment of the present invention.

A circuit board 1000 on which is mounted a semiconductor device 1 in accordance with this embodiment of the present invention is shown in FIG. 12. An organic substrate such as a glass epitaxy substrate is generally used as the circuit board 1000. Desired circuitry is formed on the circuit board 1000 as a wiring pattern of copper, or the like, and electrical connectivity is achieved by mechanically connecting this wiring pattern to the electrical connection portions 72 of the semiconductor device 1.

Figure 13:
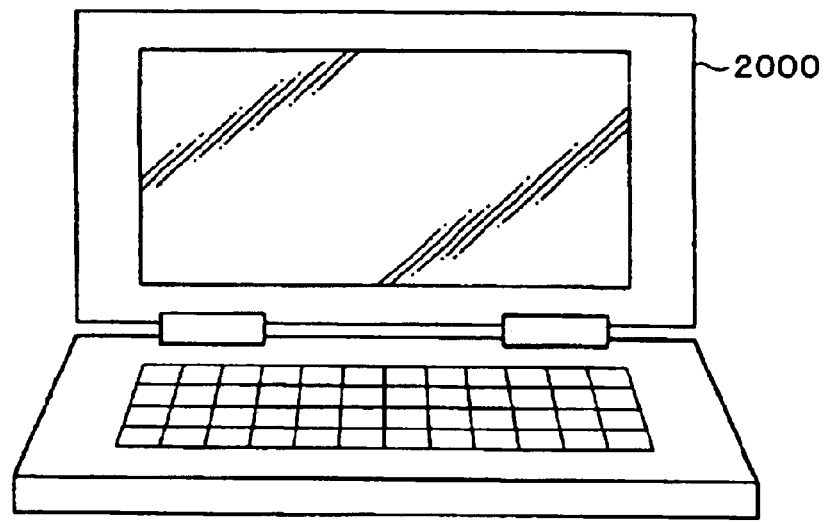
FIG. 13 shows electronic equipment having a semiconductor device in accordance with this embodiment of the present invention.
Figure 14:
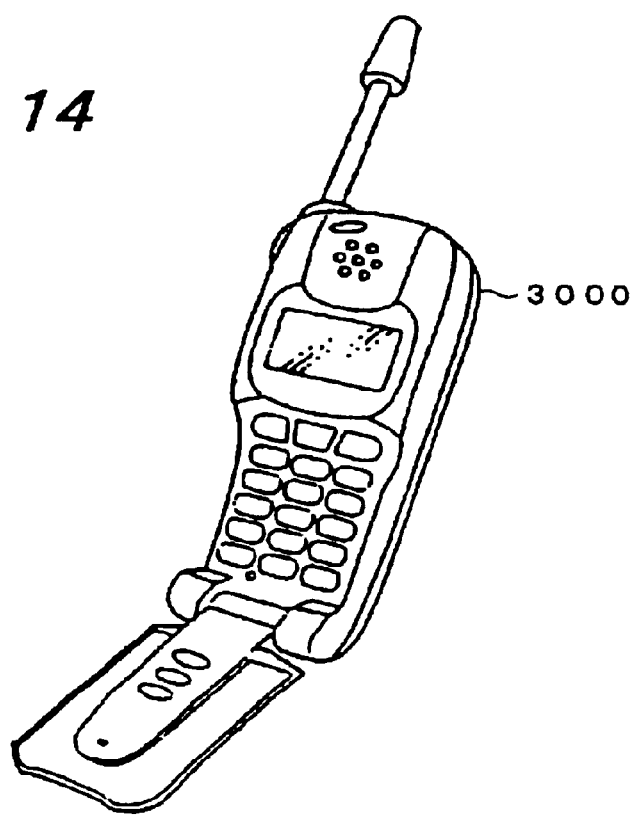
FIG. 14 shows electronic equipment having a semiconductor device in accordance with this embodiment of the present invention.

A notebook personal computer 2000 shown in FIG. 13 and a portable telephone 3000 shown in FIG. 14 are examples of electronic equipment having the semiconductor device 1 in accordance with the present invention.

Note that the term "semiconductor chip" could be replaced with "electronic element" in the above-described embodiment of the present invention, to enable the manufacture of electronic components.

Examples of electronic components fabricated by using such electronic elements include optical elements, resistors, capacitors, coils, oscillators, filters, temperature sensors, thermistors, varistors, variable resistors, or fuses, by way of example.

What is claimed is:

1. A method of manufacturing a semiconductor device, the method comprising:
   (a) forming a hole in an electrode, the electrode formed on a semiconductor element;
   (b) after the hole is formed in the electrode, forming a through-hole in the semiconductor element so as to be connected to the hole; and
   (c) forming a conductive layer in a region including an inner side of the through-hole.

2. The method of manufacturing a semiconductor device as defined in claim 1, wherein in the (c) step the conductive layer is formed on at least part of the electrode.

3. The method of manufacturing a semiconductor device as defined in claim 1, wherein the through-hole comprises an edge portion and an intermediate portion of which width is larger than a width of the edge portion.

4. The method of manufacturing a semiconductor device as defined in claim 3, wherein:
   all portions of the intermediate portion are formed at substantially the same width; and
   the through-hole comprises a tapered portion connecting the edge portion with the intermediate portion.

5. The method of manufacturing a semiconductor device as defined in claim 1, wherein the through-hole is formed in the (b) step by first forming a pinhole of a width smaller than a width of the through-hole, then expanding the pinhole.

6. The method of manufacturing a semiconductor device as defined in claim 5, wherein a cavity is formed in the (b) step at a position at which the through-hole is to be formed, then the pinhole is formed by positioning at the cavity.

7. The method of manufacturing a semiconductor device as defined in claim 5, wherein the pinhole is formed by a laser beam, then the pinhole is enlarged by wet etching.

8. The method of manufacturing a semiconductor device as defined in claim 1, the method further comprising a step of forming an electrical connection portion.

9. The method of manufacturing a semiconductor device as defined in claim 8, wherein the electrical connection portion is formed as part of the conductive layer in the (c) step.

10. The method of manufacturing a semiconductor device as defined in claim 1, the method further comprising a step of forming an insulation film on an inner surface of the through-hole, after the (b) step and before the (c) step, wherein the conductive layer is formed on the insulation film in the (c) step.

11. The method of manufacturing a semiconductor device as defined in claim 5, the method further comprising a step of forming an insulation film on a inner surface of the through-hole, after the (b) step and before the (c) step, wherein the conductive layer is formed on the insulation film in the (c) step.

12. The method of manufacturing a semiconductor device as defined in claim 7, the method further comprising a step of forming an insulation film on an inner surface of the through-hole, after the (b) step and before the (c) step, wherein the conductive layer is formed on the insulation film in the (c) step.

13. The method of manufacturing a semiconductor device as defined in claim 12, wherein the insulation film is formed by chemical vapor deposition.

14. The method of manufacturing a semiconductor device as defined in claim 1, wherein the conductive layer is formed by electroless plating.

15. The method of manufacturing a semiconductor device as defined in claim 14, wherein a catalyst is exposed in at least a region in which the conductive layer is formed, electroless plating is performed to extract a conductive material in the exposed region of the catalyst, and the conductive layer is formed from the conductive material.

16. The method of manufacturing a semiconductor device as defined in claim 1, wherein the semiconductor element is a semiconductor chip.

17. The method of manufacturing a semiconductor device as defined in claim 1, wherein the semiconductor element is part of a semiconductor wafer.

18. A method of manufacturing a semiconductor device, the method comprising a step of stacking semiconductor devices that were formed by the method of manufacturing a semiconductor device as defined in claim 1, and electrically connecting together the conductive layer of each of upper and lower semiconductor devices.

19. The method of manufacturing a semiconductor device as defined in claim 17, further comprising a step of cutting the semiconductor wafer into pieces.

* * * * *